United States Patent
Brunco et al.

(10) Patent No.: US 10,325,913 B2
(45) Date of Patent: Jun. 18, 2019

(54) METHOD, APPARATUS, AND SYSTEM HAVING SUPER STEEP RETROGRADE WELL WITH ENGINEERED DOPANT PROFILES

(71) Applicant: GLOBALFOUNDRIES INC., Grand Cayman (KY)

(72) Inventors: David Paul Brunco, Latham, NY (US); Jeffrey Bowman Johnson, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/875,609

(22) Filed: Jan. 19, 2018

(65) Prior Publication Data

US 2018/0145079 A1 May 24, 2018

Related U.S. Application Data

(62) Division of application No. 15/208,495, filed on Jul. 12, 2016, now Pat. No. 9,911,740.

(51) Int. Cl.
| | |
|---|---|
| *H01L 27/092* | (2006.01) |
| *H01L 21/02* | (2006.01) |
| *H01L 21/225* | (2006.01) |
| *H01L 21/265* | (2006.01) |
| *H01L 21/762* | (2006.01) |
| *H01L 21/8238* | (2006.01) |
| *H01L 29/10* | (2006.01) |
| *H01L 29/167* | (2006.01) |
| *H01L 21/22* | (2006.01) |

(52) U.S. Cl.
CPC .... *H01L 27/0924* (2013.01); *H01L 21/02529* (2013.01); *H01L 21/2251* (2013.01); *H01L 21/26513* (2013.01); *H01L 21/76224* (2013.01); *H01L 21/823807* (2013.01); *H01L 21/823821* (2013.01); *H01L 21/823878* (2013.01); *H01L 21/823892* (2013.01); *H01L 29/1033* (2013.01); *H01L 29/1054* (2013.01); *H01L 29/1083* (2013.01); *H01L 29/167* (2013.01); *H01L 21/22* (2013.01)

(58) Field of Classification Search
CPC ......................... H01L 27/0924; H01L 29/167; H01L 21/2251
USPC ........................................................ 257/401
See application file for complete search history.

(56) References Cited

U.S. PATENT DOCUMENTS 8,674,413 B1* 3/2014 Chi .................... H01L 27/0924
257/213

* cited by examiner

*Primary Examiner* — Anthony Ho
(74) *Attorney, Agent, or Firm* — Williams Morgan, P.C.

(57) ABSTRACT

Generally, in one embodiment, the present disclosure is directed to a method for forming a transistor. The method includes: implanting a substrate to form at least one of an n and p doped region; depositing an epitaxial semiconductor layer over the substrate; forming trenches through the epitaxial layer and partially through at least one of an n and p doped region; forming dielectric isolation regions in the trenches; forming a fin in an upper portion of the epitaxial semiconductor layer by partially recessing the dielectric isolation regions; forming a gate dielectric adjacent at least two surfaces of the fin; and diffusing dopant from at least one of the n and p doped regions at least partially into the epitaxial semiconductor layer to form a diffusion doped transition region adjacent a bottom portion of the fin.

19 Claims, 5 Drawing Sheets

METHOD, APPARATUS, AND SYSTEM HAVING SUPER STEEP RETROGRADE WELL WITH ENGINEERED DOPANT PROFILES

FIELD OF THE INVENTION

Generally, the present disclosure relates to the manufacture of sophisticated semiconductor devices, and, more specifically, to various methods and structures having super steep retrograde wells with engineered dopant profiles.

DESCRIPTION OF THE RELATED ART

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one region on the semiconductor wafer to another.

In this manner, integrated circuit chips may be fabricated. In some cases, integrated circuits or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuit (e.g., CMOS logic architecture), designers often select pre-designed functional cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or smaller integrated circuit designs.

The pre-designed functional cells are often used to design transistors, such as metal oxide field effect transistors (MOSFETs or FETs). A FET is a device that typically includes a source region, a drain region, a channel region that is positioned between the source region and the drain region, and a gate electrode positioned above the channel region. Current flowing through the FET is controlled by controlling the voltage applied to the gate electrode. If a voltage that is less than the threshold voltage of the device is applied to the gate electrode, then there is no current flowing through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this reduced spacing between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

There are essentially two types of FETs: planar FETs and so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a channel between the source and drain of a transistor. The gate is then deposited such that it wraps around the fin to form a trigate structure. Since the channel is extremely thin, the gate would generally have a greater control over the carriers within. However, when the transistor is switched on, the small size of the channel may limit the current flow. Therefore, multiple fins may be used in parallel to provide greater current flow for increased drive strength.

FIG. 1 illustrates a stylized depiction of a conventional finFET device. A finFET device 100 illustrated in FIG. 1 comprises a plurality of "fins" 110. The semiconductor device may be positioned in a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is substantially similar for all of the fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a desirable packing of the devices per square area resulting in a denser design, or more efficient use of silicon wafer area. For a bulk finFET, the region beneath the channel is referred to as the well and is doped to the opposite polarity of the source and drains. For a pMOS device, the well is n-type doped and referred to as an nWell. For an nMOS device, the well is p-type doped and referred to as a pWell. The upper region of each well type that is immediately beneath the channel is commonly referred to as the Punch Through Stop (PTS) region and serves to limit unwanted current flow between the source and drain regions when the finFET is in the off-state.

The scaling down of integrated circuits coupled with higher performance requirements for these circuits have prompted an increased interest in finFETs. FinFETs generally have the increased effective channel widths, which includes channel portions formed on the sidewalls and top portions of the fins. Since drive currents of the finFETs are proportional to the channel widths, finFETs generally display increased drive current capabilities.

FinFET devices are known to include a dopant profile commonly known as Super Steep Retrograde Well (SSRW). Typically, in a finFET employing SSRW, it is desirable that the channel itself has no or low doping and the PTS region immediately below the channel is moderately doped. In this type of structure, the PTS is typically formed by implanting dopants that pass through the channel. It is desirable that there be no or low doping in the channel to minimize Random Dopant Fluctuation (RDF) and its effect on $V_T$. However, implant straggle associated with the PTS dopants, often results in a significant amount of dopant remaining in the channel, which may be problematic and may cause undesirable electrical properties in the finFET device. Unwanted diffusion of dopant post implant may also degrade finFET devices.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, in one embodiment, the present disclosure is directed to a method for forming a transistor. The method includes: implanting a substrate to form at least one of an n and p doped region; depositing an epitaxial semiconductor layer over the substrate; forming trenches through the epitaxial layer and partially through at least one of an n and p doped region; forming dielectric isolation regions in the trenches; forming a fin in an upper portion of the epitaxial semiconductor layer by partially recessing the dielectric isolation regions; forming a gate dielectric adjacent at least two surfaces of the fin; and diffusing dopant from at least one of the n and p doped regions at least partially into the epitaxial semiconductor layer to form a diffusion doped transition region adjacent a bottom portion of the fin.

Generally, in a second embodiment, the present disclosure is directed to finFET transistor. The transistor is comprised of a substrate, a fin, a subfin region, and a moderately doped region. The substrate has at least one of an n doped region and a p doped region. The fin has a lowly doped channel region. The subfin region includes a dopant diffusion inhibiting material intermediate the substrate and the channel of the fin, and the moderately doped region is beneath the dopant diffusion inhibiting material.

BRIEF DESCRIPTION OF THE DRAWINGS

The disclosure may be understood by reference to the following description taken in conjunction with the accompanying drawings, in which like reference numerals identify like elements, and in which.

Figure 1:
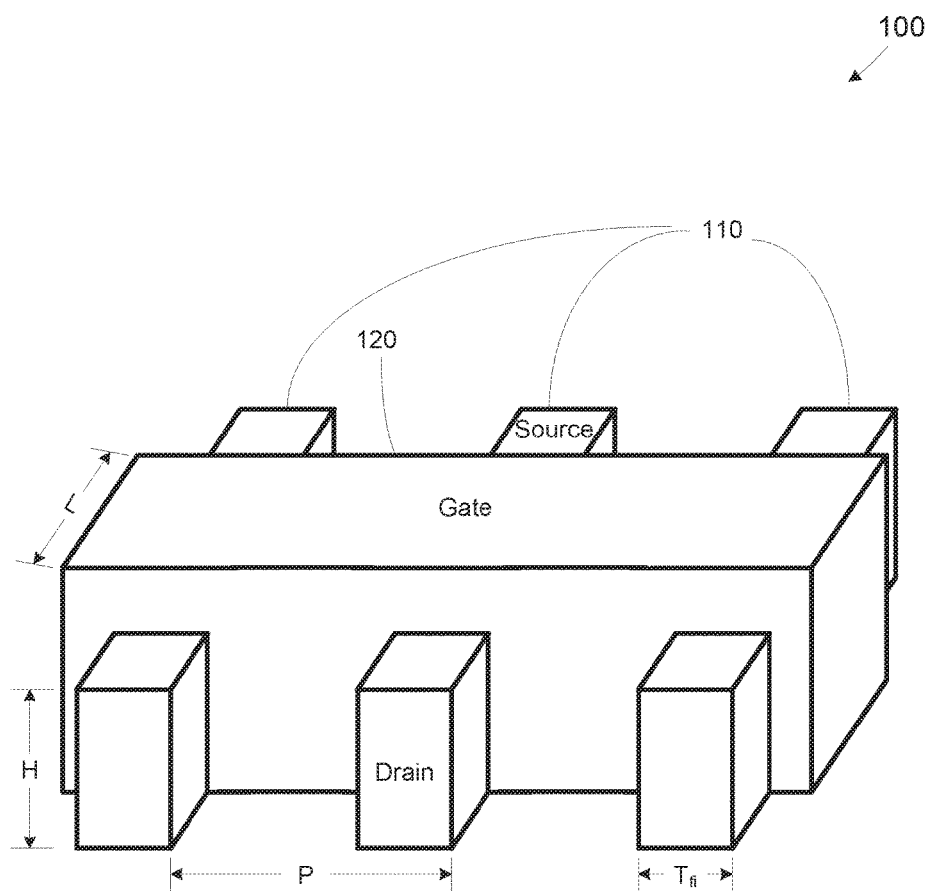
FIG. 1 illustrates a depiction of a conventional finFET device.
Figure 2:
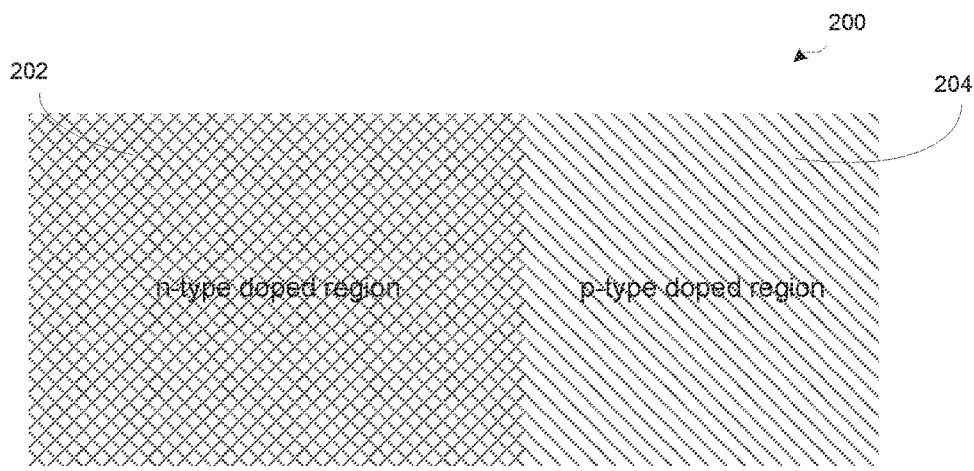
FIGS. 2-5 illustrate a stylized depiction of a series of process steps that are utilized to produce a first embodiment of a finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to semiconductor devices (e.g., finFET transistors) having Super Steep Retrograde Wells (SSRW) that use patterned n-type and p-type ion implants followed by epitaxial growth of a semiconductor layer, and a controlled diffusion process to create engineered dopant profiles to produce finFETs that have no or low doping in the channel to minimize Random Dopant Fluctuation (RDF) and its effect on $V_T$ while providing sufficient dopant below the channel to form a Punch Through Stop (PTS). In one embodiment, the semiconductor layer contains a material that suppresses the diffusion of one or both of the n-type and p-type dopants.

FIGS. 2-5 illustrate one embodiment of a structure and a methodology for forming the structure that includes finFET transistors with a channel that has no or low doping. The process begins in FIG. 2 where a semiconductor wafer 200 is shown with a first region that has received an n-type dopant implant 202 and a second region that has received a p-type dopant implant 204. Those skilled in the art will appreciate that it may be useful to utilize a Zero Layer (ZL) mask to place alignment marks on the wafer 200 that may be used as a guide for litho alignment for the n-type and p-type implant regions, as well as subsequent processes described herein. The n-type regions are typically referred to as nWells and will ultimately provide junction isolation for the pMOS finFET. Similarly, the p-type regions are typically referred to as pWells and will ultimately provide junction isolation for the nMOS finFET.

Any of a variety of methodologies and dopants may be utilized to form the n-type and p-type regions 202, 204. Turning first to the implantation process for forming the n-type region 202, the implantation process may include multiple implants using multiple dopants to form the PTS, as well as deeper implants for device junction isolation. Typical species for the nWell implants include phosphorus (P), arsenic (As) and antimony (Sb). Typically, P will be used for the deeper implants, and As or Sb may be used for shallower implants. Peak dopant concentrations for these implants will typically be between about $8 \times 10^{17}$ atoms/cm$^3$ and about $2 \times 10^{19}$ atoms/cm$^3$, and in some embodiments between about $1 \times 10^{18}$ atoms/cm$^3$ and about $1 \times 10^{19}$ atoms/cm$^3$. In one embodiment, the average dopant concentration over about the first 40 nm of depth will typically be between about $8 \times 10^{17}$ atoms/cm$^3$ and about $6 \times 10^{18}$ atoms/cm$^3$.

Typical species for the pWell implants include boron (B), gallium (Ga), and indium (In). Typically, B may be used for deeper implants, and B, Ga, or In, may be used for shallower implants. Peak dopant concentrations for these implants will typically be between about $8 \times 10^{17}$ atoms/cm$^3$ and about $2 \times 10^{19}$ atoms/cm$^3$, and in some embodiments between about $1 \times 10^{18}$ atoms/cm$^3$ and about $1 \times 10^{19}$ atoms/cm$^3$. In one embodiment, the average dopant concentration over about the first 40 nm of depth will typically be between about $8 \times 10^{17}$ atoms/cm$^3$ and about $6 \times 10^{18}$ atoms/cm$^3$.

An optional sacrificial screen dielectric (not shown, e.g., SiO2, SiON, SiN, stacks thereof, etc.) may be deposited prior to the well implants. The sacrificial screen dielectric may typically have a thickness in the range of about 2 to about 15 nm, and may serve a variety of purposes. For example, the screen dielectric may advantageously reduce damage to the underlying Si wafer 200, it may assist in reducing channeling of implanted species, it may reduce outgassing of dopant species (e.g., As) during a subsequent annealing process, and it may provide a more abrupt final dopant profile by removing the low energy straggled implanted ions that stop in the screen dielectric. Those skilled in the art will appreciate that after the implant process and optional annealing processes are completed, the screen dielectric will typically be removed using any of a variety of conventional wet and/or dry chemistries. If the optional sacrificial screen dielectric is used, those skilled in the art will appreciate that its effect on subsequent implant processes should be taken into consideration, particularly with respect to the depth of the implanted dopant(s).

Following the implantation process, it may be useful to subject the wafer 200 to an anneal process to reduce surface damage to improve a crystalline surface structure to serve as a seed for subsequent epitaxial growth. The anneal process may be performed as a batch process with multiple wafers in a furnace, a single wafer process performed in a Rapid Thermal Anneal (RTA) chamber or a Laser Spike Anneal (LSA) chamber, or by some combination thereof. Thereafter, the screen dielectric, if used, may be removed as discussed above, and then conventional epitaxial pre-cleans and a conventional epitaxial pre-bake may be performed. The pre-brake process may be in the range of about 650 to about 1000° C. for a time period in the range of about 10 s to about 300 s.

Figure 3:
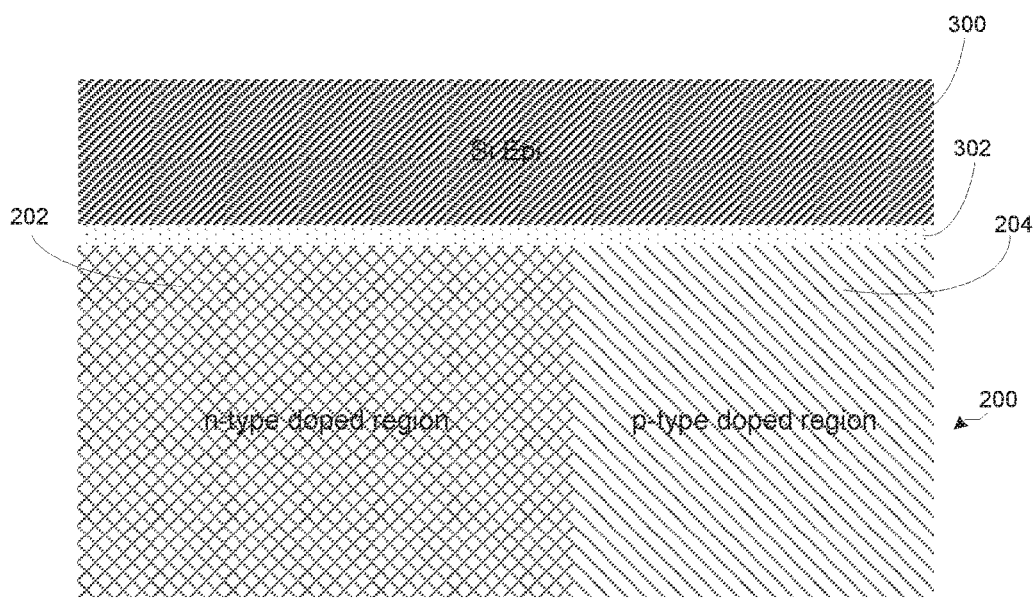

In FIG. 3, a Si epitaxial layer 300 has been grown over the wafer 200 using any of a variety of techniques. Those skilled in the art will appreciate that the thickness of the Si epi layer 300 may vary substantially without departing from the spirit and scope of the instant invention. For example, it is envisioned that the thickness of the Si epi layer 300 may vary in the range of about 30 to about 100 nm, with a preferred range of about 40 nm to about 80 nm so that fins of a desired height may be formed therewith. The Si epi layer 300 may be nominally undoped or very lowly doped and may be grown using either selective or nonselective epi processes. However, nonselective epi processes are typically preferred because they can be performed at a lower cost and with increased uniformity.

In an alternative embodiment, a diffusion suppression layer of, for example, epitaxial silicon carbon (SiC) 302 may be deposited intermediate the wafer 200 and the Si epi layer 300. The SiC layer 302 may be used to suppress diffusion of one or more of the dopant species during subsequent processing. In particular, C is useful in suppressing diffusion of boron (B) and phosphorus (P). While high levels of carbon may provide an effective diffusion barrier, these high levels can have deleterious effects such as precipitation of SiC phases or other defects. For this reason, the preferred amount of carbon is not so high as to provide a perfect diffusion barrier, but should be high enough to provide significant suppression of diffusion for one or more dopant species. In one embodiment, the concentration of C may be established in the range of about 0.05 to about 1.0% with a thickness of about 2 nm to about 30 nm, depending upon the concentration of C. In a preferred embodiment, the concentration of C is about 0.1 to about 0.4% and the layer 302 has a thickness of about 5 nm to about 20 nm.

Figure 4:
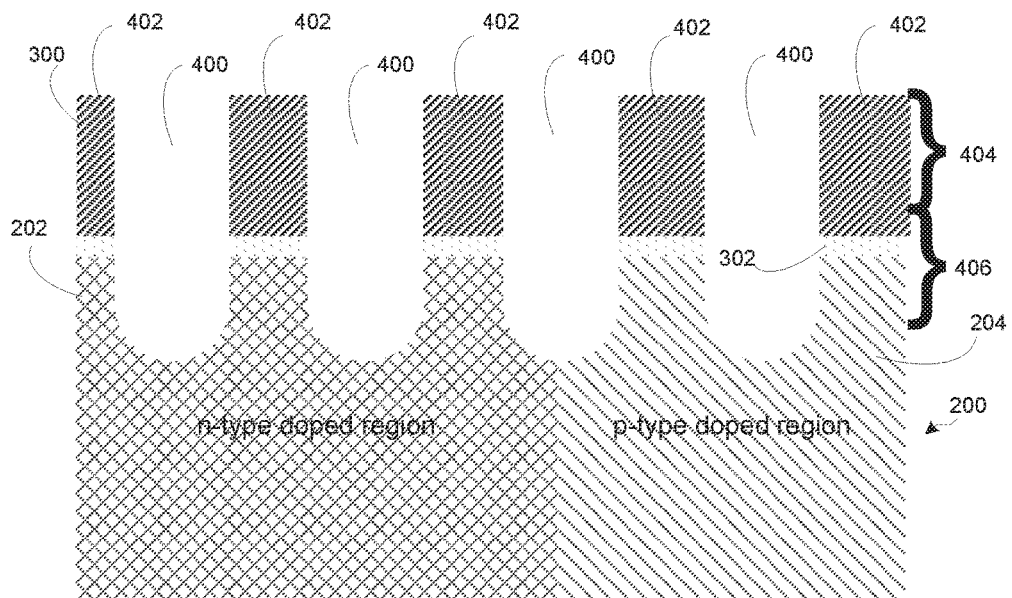

As shown in FIG. 4, conventional patterning and etching processes are used to form a series of substantially similar recesses 400 in the Si epi layer 300 and the underlying n-type doped region 202 and p-type doped region 204, as well as the optional SiC layer 302, if it is used, to form a plurality of lines 402. An upper "fin" portion 404 of these lines will eventually be wrapped by a gate and become a channel of the device. A lower "subfin" portion 406 of these lines may be used to provide a punch through stop and electrical isolation. The patterning techniques may, for example, include self-aligned double and quadruple patterning methods, or lithography techniques using extreme ultraviolet (UV) or e-beam processes. An additional layer used for patterning purposes, e.g. pad oxide and pad nitride, may be formed above the fins at this point in the flow, but are not indicated in FIG. 4. The etch process would preferably achieve comparable etch depths and widths in both the n-type doped and p-type doped regions 202, 204 to produce relatively narrow lines 402.

In one embodiment, the etch process may be performed using a conventional dry etch process, such as a Reactive-Ion Etching (RIE) process. In another embodiment, the etch process may comprise a combination of dry etch process and wet etch process, such as using hydrofluoric acid (HF) chemical etching. It is envisioned that a single etching process would be used to complete the etch process through the Si epi, the SiC (if used), and into the n-type/p-type doped regions 202, 204; however, those skilled in the art will appreciate that the etch process may be divided into a series of etching processes.

Figure 5:
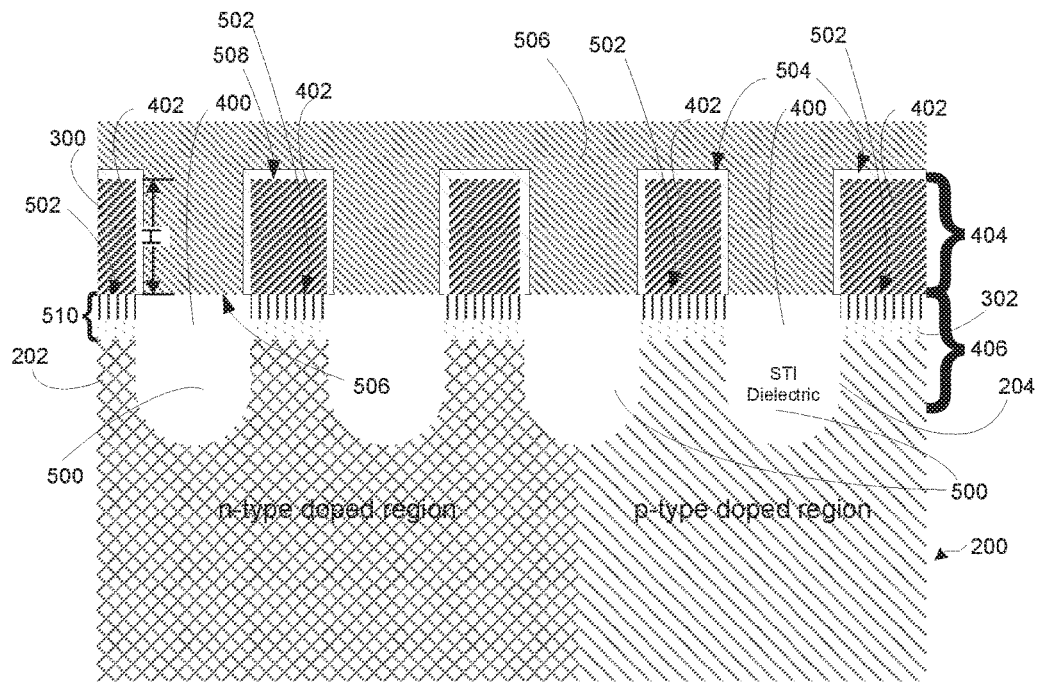

As shown in FIG. 5, after the etching of the lines 402 is complete, it may be useful to implement a Shallow Trench Isolation (STI) process and, at least partially, fill the recesses 400 with an STI dielectric 500. Those skilled in the art will appreciate that during the STI process, it may be useful to control temperature so as to reduce undesirable dopant diffusion in channel regions 502 of the finFETs. Upper limits on temperature are time dependent. For example, a furnace process with an anneal time in excess of 30 minutes with slow ramp up and slow ramp down rates may be limited to 850° C. or lower. For shorter anneal processes of about 10 s, a temperature of about 1000° C. may be accommodated.

Additionally, in some embodiments it may be useful to include a SiN liner (not shown) in at least the recesses 400 near the interface of the n-type/p-type doped regions 202/204 and the Si layer 300 to reduce dopant loss (e.g., B and In) to the STI dielectric 500.

Hereafter, conventional fin reveal, gate formation, junction formation, contact formation, metallization, and the like, may proceed using well known processes. For example, after the STI dielectric 500 layer is deposited, a chemical-mechanical polishing (CMP) process may be performed, followed by an anneal process to improve the quality of the STI dielectric. An oxide etching process may be performed to reveal the fins 502 by etching the STI dielectric 500 to the level shown in FIG. 5. Thereafter, a conventional gate formation process may be performed to produce the gate dielectric 504 and gate electrode 506. These processes are readily known to those of ordinary skill in the art, and thus, are not discussed in greater detail herein to avoid unnecessarily obfuscating the description presented herein.

Those skilled in the art will appreciate that the fin 502 bases substantially coincide with the top surface 506 of the STI dielectric 500, and thus, the height of the fins is the distance between the top surface 506 of the STI dielectric 500 and the top surface 508 of the fin (identified by H in FIG. 5). In some embodiments, the height H of the fin 502 may be about 40 nm.

Beginning with the deposition of the epitaxial SiC 302 (optional) and Si 300, as discussed in FIG. 3, and throughout the overall process flow, upward diffusion of dopant from the n-type and p-type doped regions 202, 204 can be engineered to fabricate a final dopant profile that places appropriate levels of dopant in an epitaxial subfin region 510 between the top of the original position of the n-type and p-type dopant regions 202, 204 in the substrate 200 and the bottom of the fin 502. In some embodiments, it may be desirable if placement of the peak in the PTS dopant is not immediately beneath the fin 502, but rather, is located a distance below the fin 502.

Figure 6:
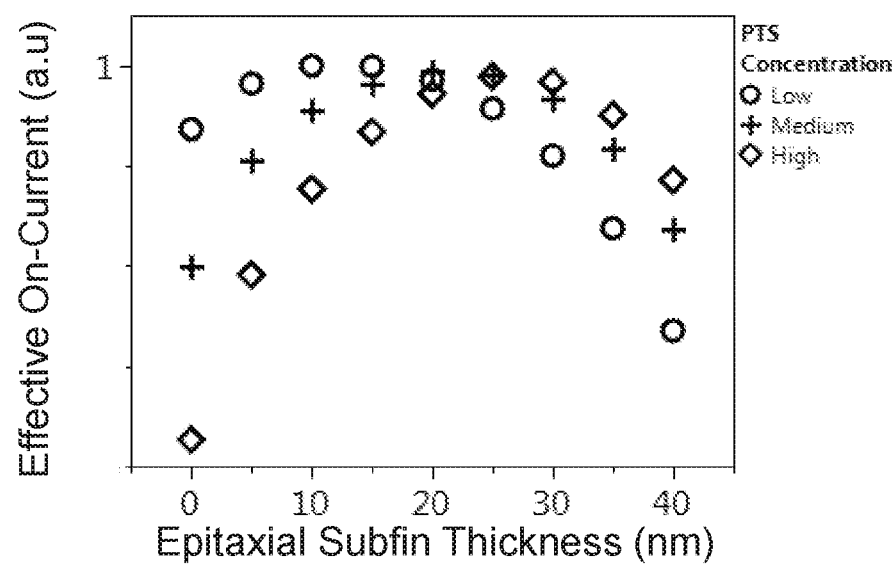
FIG. 6 illustrates an exemplary graphical representation of electrical data for an embodiment of a finFET device.

FIG. 6 shows a graph of the effective on-state current vs the thickness of the epitaxial subfin region 510 for a typical device and an engineered degree of dopant diffusion from the n-type and p-type doped regions 202, 204 upward into the epitaxial subfin region 510. Effective on-state current is a metric for performance, where a higher number indicates higher performance. As can be seen from FIG. 6, a desired epitaxial subfin region thickness is in a range of about 20 nm to about 25 nm for medium PTS doping where the n-type and p-type regions 202, 204 are uniformly doped to the very top of the wafer 200. This thickness will be larger for higher PTS doping and lower for lower PTS doping. This value will also be smaller if the dopant profiles in the regions 202, 204 reach a peak value at a depth extending further into the wafer, as is typically the case. While FIG. 6 illustrates the basic trends, the actual desired distance will also depend upon the implant conditions, actual dopant distances, the gate length, the positions of the source and drains, etc.

The epitaxial subfin region 510, which becomes part of the PTS region in the final device, is doped in this embodiment primarily using solid source diffusion from the implanted n-type and p-type regions 202, 204. This differs from prior art whereby this subfin region 510 is doped directly by ion implantation or by diffusion from solid source dopants (e.g. doped glasses) on the sides of the subfin region. Engineering the degree of diffusion into the epitaxial subfin region 510 requires controlling the original dopant profiles in the n-type and p-type regions 202, 204 to a desired level, the thermal budget in the overall process flow, the thickness of the epitaxial subfin region 510, and other process variables. In practice, limiting diffusion to the required level during the multiple thermal budgets in the process flow can be challenging, which is why suppression (but not elimination) of diffusion by the optional SiC 302 can be useful. In one embodiment, the thickness of the epitaxial subfin region 510 may be in the range of about 2 nm to about 40 nm. In a preferred embodiment, the epitaxial subfin region thickness may be in the range of about 5 nm to about 25 nm. The dopant concentration in this epitaxial subfin region 510 will be highest near the bottom and generally decreases toward the fin channel. At some vertical location, the doping level becomes effectively undoped, and/or lowly doped, less than about $8 \times 10^{17}$ atoms/cm$^3$). While that will be near the bottom of the fin 502, in practice, acceptable behavior can be obtained if that transition occurs within a reasonable distance from the bottom of the fin 502. In one embodiment, the transition to undoped or lowly doped occurs within 15 nm of the bottom of the fin 502 and within 10 nm in a preferred embodiment. Additionally, after the process is complete, the region below the SiC layer 302 will be moderately doped (e.g., in a range of about $8 \times 10^{17}$ cm$^{-3}$ to about $2 \times 10^{19}$ cm$^{-3}$). In some embodiments, the dopant concentration in the epitaxial subfin region 510 adjacent to the bottom of the fin 502 will be lower by at least a factor of 2 than the dopant concentration in the epitaxial subfin region 510 adjacent to the n-type and p-type doped regions 202, 204. In other embodiments, this dopant concentration reduction factor will be in a range to 5 to 100.

Figure 7:
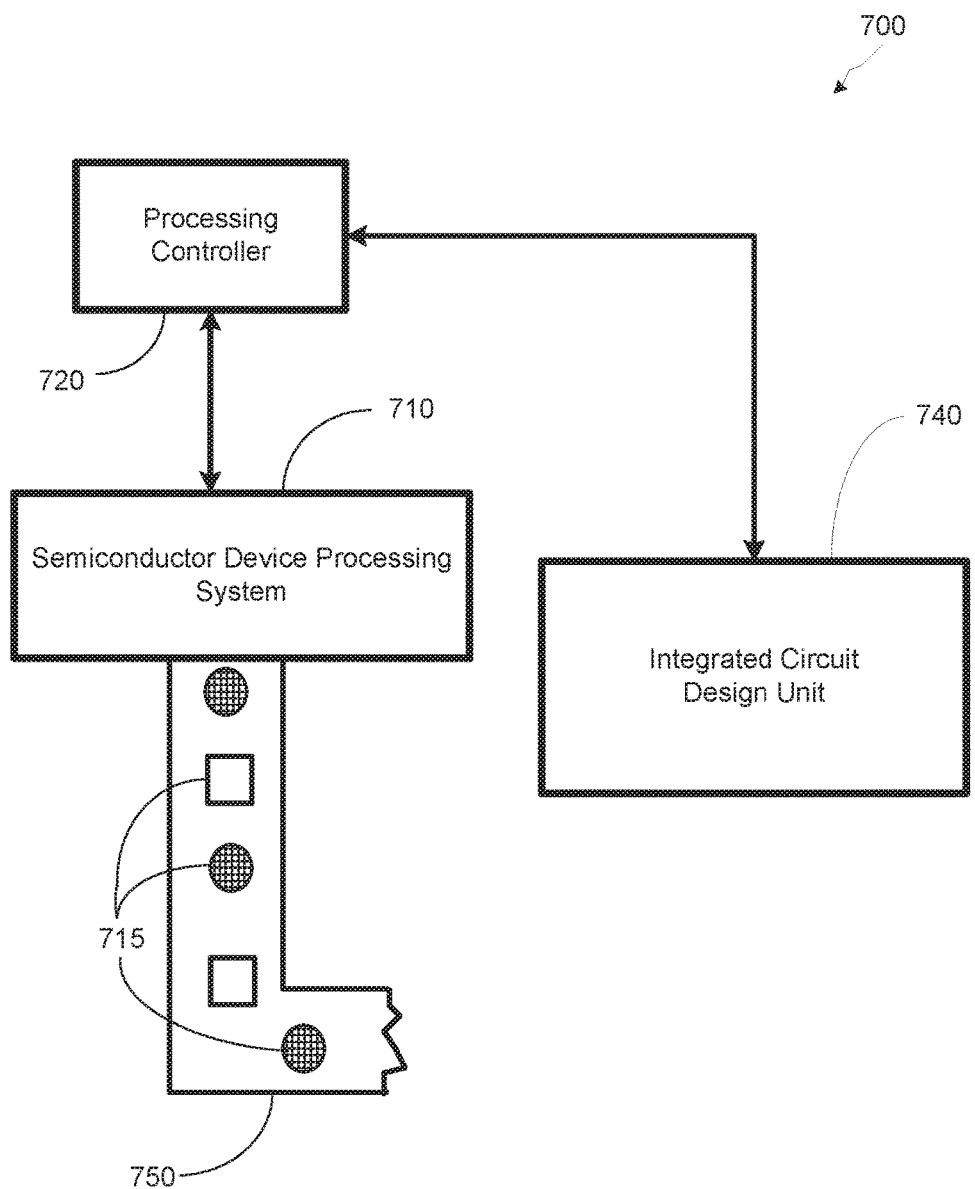
FIG. 7 illustrates a stylized depiction of a system for fabricating a semiconductor device comprising a finFET device in accordance with embodiments herein.

Turning now to FIG. 7, a stylized depiction of a system for fabricating a semiconductor device comprising a finFET device in accordance with embodiments herein is illustrated. The system 700 of FIG. 7 may comprise a semiconductor device processing system 710 and a design unit 740. The semiconductor device processing system 710 may manufacture integrated circuit devices based upon one or more designs provided by the design unit 740.

The semiconductor device processing system 710 may comprise various processing stations, such as etch process stations, ion implantation stations, photolithography process stations, CMP process stations, etc. One or more of the processing steps performed by the processing system 710 may be controlled by the processing controller 720. The processing controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 710 may produce integrated circuits on a medium, such as silicon wafers. The production of integrated circuits by the device processing system 710 may be based upon the circuit designs provided by the integrated circuits design unit 740. The processing system 710 may provide processed integrated circuits/devices 715 on a transport mechanism 750, such as a conveyor system. In some embodiments, the conveyor system may be sophisticated clean room transport systems that are capable of transporting semiconductor wafers. In one embodiment, the semiconductor device processing system 710 may comprise a plurality of processing steps, e.g., the 1$^{st}$ process step, the 2$^{nd}$ process set, etc., as described above.

In some embodiments, the items labeled "715" may represent individual wafers, and in other embodiments, the items 715 may represent a group of semiconductor wafers, e.g., a "lot" of semiconductor wafers. The integrated circuit or device 715 may be a transistor, a capacitor, a resistor, a memory cell, a processor, and/or the like. In one embodiment, the device 715 is a transistor.

The integrated circuit design unit 740 of the system 700 is capable of providing a circuit design that may be manufactured by the semiconductor processing system 710. The design unit 740 may receive data relating to the functional cells to utilize, as well as the design specifications for the integrated circuits to be designed. In one embodiment, the integrated circuit design unit 740 may comprise finFETs having implantations regime of the type described herein.

The system 700 may be capable of performing analysis and manufacturing of various products involving various technologies. For example, the system 700 may use design and production data for manufacturing devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A finFET transistor, comprising:
   a substrate having at least one of an n doped region and a p doped region;
   a fin having a lowly doped channel region;
   a subfin region including a dopant diffusion inhibiting material intermediate the substrate and the channel of the fin, wherein the dopant diffusion inhibiting material is silicon carbon having a concentration of carbon less than 2.0%; and
   a moderately doped region beneath the dopant diffusion inhibiting material.

2. The finFET transistor of 1, wherein the silicon carbon has a concentration of carbon in a range of about 0.05 to about 1.0%.

3. The finFET transistor of claim 1, wherein the silicon carbon has a thickness in a range of about 2 nm to about 30 nm.

4. The finFET transistor of claim 1, wherein the silicon carbon has a concentration of carbon in a range of about 0.1 to about 0.4% and has a thickness in a range of about 5 nm to about 20 nm.

5. The finFET transistor of claim 1, wherein the lowly doped channel region has an average active dopant concentration of less than about $8 \times 10^{17}$ cm$^{-3}$.

6. The finFET transistor of claim 1 wherein the moderately doped region has an average active dopant concentration in a range of about $8 \times 10^{17}$ cm$^{-3}$ and about $6 \times 10^{18}$ cm$^{-3}$ in a region comprising at least about 40 nm adjacent the dopant diffusion inhibiting material.

7. The finFET transistor of claim 1 wherein the dopant diffusion inhibiting material has a thickness in a range of about 5 nm to about 20 nm.

8. The finFET transistor of claim 1, further comprising a shallow trench isolation (STI) dielectric adjacent a first side and a second side of the subfin region.

9. The finFET transistor of claim 1, further comprising:
   a gate dielectric disposed over the fin; and
   a gate electrode disposed over the gate dielectric.

10. A finFET transistor, comprising:
    a substrate comprising an n doped region and a p doped region;
    a first fin disposed above the n doped region and having a doped channel region having a first doping concentration;
    a second fin disposed above the p doped region and having a doped channel region having the first doping concentration;
    a first subfin region including a dopant diffusion inhibiting material intermediate the substrate and the channel of the first fin;
    a second subfin region including a dopant diffusion inhibiting material intermediate the substrate and the channel of the second fin;

a first doped region beneath the first subfin region and having a second doping concentration; and a second doped region beneath the second subfin region and having the second doping concentration; wherein the second doping concentration is greater than the first doping concentration.

11. The finFET transistor of claim 10, wherein the dopant diffusion inhibiting material of the first subfin region and the dopant diffusion inhibiting material of the second subfin region comprise silicon carbon and wherein the dopant diffusion inhibiting material of the first subfin region and the dopant diffusion inhibiting material of the second subfin region each have a concentration of carbon in a range of about 0.05 to about 1.0%.

12. The finFET transistor of claim 10, wherein the dopant diffusion inhibiting material of the first subfin region and the dopant diffusion inhibiting material of the second subfin region each have a thickness in a range of about 2 nm to about 30 nm.

13. The finFET transistor of claim 12, wherein the dopant diffusion inhibiting material of the first subfin region and the dopant diffusion inhibiting material of the second subfin region each have a thickness in a range of about 5 nm to about 20 nm.

14. The finFET transistor of claim 10, wherein the dopant diffusion inhibiting material of the first subfin region and the dopant diffusion inhibiting material of the second subfin region each have a concentration of carbon in a range of about 0.1 to about 0.4% and a thickness in a range of about 5 nm to about 20 nm.

15. The finFET transistor of claim 10, wherein the doped channel region of the first fin and the doped channel region of the second fin each have an average active dopant concentration of less than about $8 \times 10^{17}$ cm$^{-3}$.

16. The finFET transistor of claim 10, further comprising a shallow trench isolation (STI) dielectric between the first subfin region and the second subfin region.

17. The finFET transistor of claim 10, further comprising:
a first gate dielectric disposed over the first fin;
a second gate dielectric disposed over the second fin; and
a gate electrode disposed over the first gate dielectric and the second gate dielectric.

18. A finFET device, comprising:
a substrate comprising an n doped region and a p doped region;
a first fin disposed above the n doped region and having a first doped channel region;
a second fin disposed above the p doped region and having a second doped channel region;
a first subfin region including a dopant diffusion inhibiting material intermediate the substrate and the channel of the first fin;
a second subfin region including a dopant diffusion inhibiting material intermediate the substrate and the channel of the second fin;
a third doped region beneath the first subfin region; and
a fourth doped region beneath the second subfin region;
wherein the first and second doped regions each has a first dopant concentration and the third and fourth doped regions each has a second dopant concentration, wherein the second dopant concentration is greater than the first dopant concentration.

19. The finFET device of claim 18, further comprising:
a shallow trench isolation (STI) dielectric between the first subfin region and the second subfin region;
a first gate dielectric disposed over the first fin;
a second gate dielectric disposed over the second fin; and
a gate electrode disposed over the first gate dielectric and the second gate dielectric.

* * * * *